(12) United States Patent
Jung

(10) Patent No.: US 8,278,209 B2
(45) Date of Patent: Oct. 2, 2012

(54) METHOD FOR MANUFACTURING A SEMICONDUCTOR DEVICE USING A HARDMASK LAYER

(75) Inventor: Chung-Kyung Jung, Anyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 501 days.

(21) Appl. No.: 12/536,391

(22) Filed: Aug. 5, 2009

(65) Prior Publication Data
US 2010/0032786 A1 Feb. 11, 2010

(30) Foreign Application Priority Data
Aug. 8, 2008 (KR) .................. 10-2008-0077958

(51) Int. Cl.
*H01L 21/4763* (2006.01)
(52) U.S. Cl. ........ 438/639; 438/629; 438/637; 438/640; 257/774
(58) Field of Classification Search .................. 257/777; 438/639
See application file for complete search history.

(56) References Cited

U.S. PATENT DOCUMENTS

| 6,989,575 B2 | 1/2006 | Gates et al. | |
|---|---|---|---|
| 2003/0040136 A1* | 2/2003 | Eriksen et al. | 438/50 |
| 2003/0199149 A1* | 10/2003 | Lee et al. | 438/424 |
| 2004/0140564 A1* | 7/2004 | Lee et al. | 257/758 |
| 2007/0018266 A1* | 1/2007 | Dupont et al. | 257/440 |
| 2007/0148848 A1* | 6/2007 | Kim et al. | 438/199 |

FOREIGN PATENT DOCUMENTS
WO WO 2007-130731 11/2007
* cited by examiner

Primary Examiner — Ajay K Arora
(74) Attorney, Agent, or Firm — Sherr & Jiang, PLLC

(57) ABSTRACT

A semiconductor device and a method for manufacturing the device include connecting a second wafer to a first wafer, forming a hard mask layer on and/or over a backside of the second wafer, forming a hard mask pattern over the second layer and then forming a via hole by etching the first and the second wafers to a predetermined depth using the hard mask pattern as an etching mask.

15 Claims, 6 Drawing Sheets

METHOD FOR MANUFACTURING A SEMICONDUCTOR DEVICE USING A HARDMASK LAYER

Figure 1A:
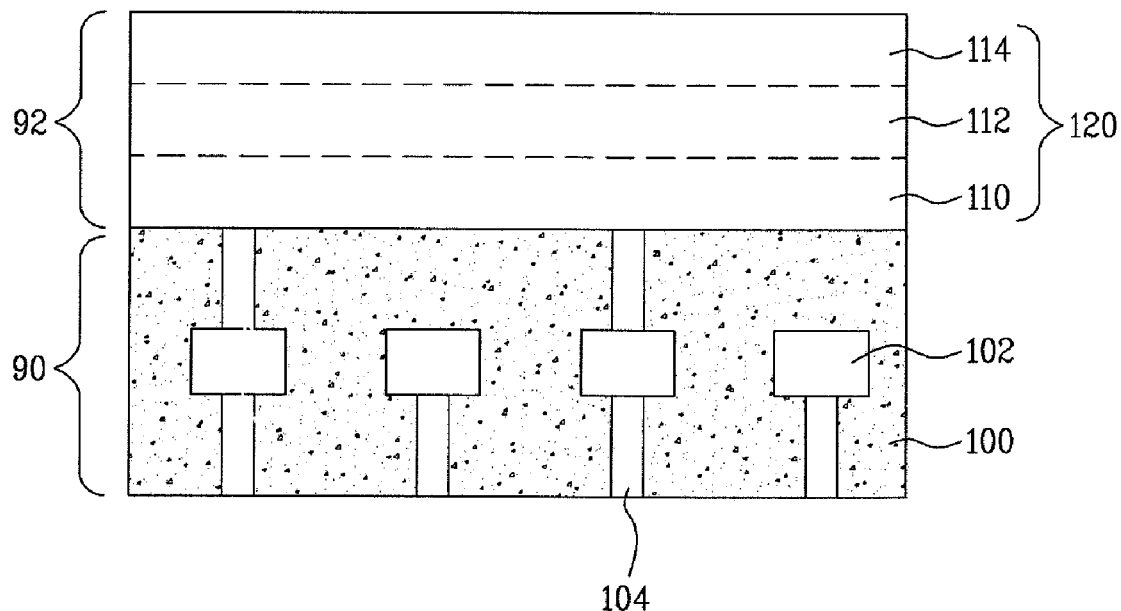

The present application claims priority under 35 U.S.C. §119 to Korean Patent Application No. 10-2008-0077958, filed on Aug. 8, 2008, which is hereby incorporated by reference in its entirety.

BACKGROUND

In accordance with development of device technology, research for an high-integrated circuit (IC) have been actively performed as one strategic product distinctive from CMOS image sensor (CIS). Using a semiconductor manufacturing method, a color filter and a micro lens are formed at an upper part of a photodiode. On the other hand, using a high IC manufacturing method which is under active research, a photodiode is formed on and/or over a bare Si wafer by $H_2$ ion implantation and the photodiode is then bonded to a pattern wafer. Here, tungsten (W) may be used to connect those two wafers. To accomplish this, via holes are formed in the respective wafers, having a minimum width of about 10 μm and a minimum depth of about 70 μm. Such a small size of the via holes causes difficulty in thorough removal of residues remaining in the via holes. Although etching may be performed to produce a via plug and then a native oxide is removed using an HF-based etchant, a process removing residues as a byproduct is not widely known. In addition, since a Ti/TiN layer used as a barrier metal also needs to be removed in addition to the W, it becomes complicated to set up the process for bonding the two wafers so that the W, Ti and TiN layers are removed simultaneously up to the bonding portion. Meaning, the necessity for simultaneously and selectively processing the W, Ti and TiN layers is currently growing.

SUMMARY

Embodiments relate to a semiconductor device such as a high-integrated circuit (IC) structure and a method for manufacturing the same that interconnects two wafers.

Embodiments relate to a semiconductor device and a manufacturing method thereof in which two wafers are bonded by a metal layer and which thoroughly, selectively and simultaneously removes residues generated during formation of a via hole and also a barrier metal and the metal layer remaining on and/or over a hard mask.

In accordance with embodiments, a manufacturing method for a semiconductor device may include at least one of the following: connecting a second wafer to an upper part of a first wafer; and then forming a hard mask layer on and/or over a backside of the second wafer; and then forming a photoresist pattern at an upper part of the hard mask layer to expose a via hole region; and then forming a hard mask pattern by etching the hard mask layer using the photoresist pattern as an etching mask; and then forming a via hole by etching the first and the second wafers to a predetermined depth using the hard mask pattern as an etching mask.

In accordance with embodiments, a method of manufacturing a semiconductor device may include at least one of the following: connecting a second wafer to a first wafer; and then forming a hard mask layer over an exposed surface of the second wafer; and then forming a photoresist pattern at an exposed surface of the hard mask layer to expose a via hole region; and then forming a hard mask pattern by etching the hard mask layer using the photoresist pattern as an etching mask; and then forming a via hole by etching the first wafer and the second wafer to a predetermined depth using the hard mask pattern as an etching mask.

In accordance with embodiments, a method of manufacturing a semiconductor device may include at least one of the following: connecting a photodiode to an exposed surface of a first dielectric layer having a via contact and a first metal layer embedded in the first dielectric layer and connected to the via contact; and then forming a second dielectric layer over an exposed surface of the photodiode; and then forming a via hole extending through the second dielectric layer and the photodiode and partially through the first dielectric layer; and then performing a first cleaning process to remove residues from the via hole; and then performing a second cleaning process to remove any residues remaining in the via hole after performing the first cleaning process; and then forming a barrier metal layer over the second dielectric layer and sidewalls of the via hole; and then forming a second metal layer over the barrier metal layer and filling the via hole; and then selectively removing portions of the barrier metal layer and the second metal layer to expose portions of the via hole.

In accordance with embodiments, a semiconductor device may include at least one of the following: a patterned first wafer; a second wafer connected to an upper part of the first wafer; a barrier metal embedded in a via hole formed from a backside of the second wafer to a predetermined depth of the first wafer; and a metal layer formed on and/or over an upper part of the barrier metal to fill the via hole such that the barrier metal and the metal layer are formed from the first wafer to a bonding region of the second wafer.

In accordance with embodiments, a semiconductor device may include at least one of the following: a first dielectric layer; a via contact formed in the first dielectric layer; a first metal layer embedded in the first dielectric layer and connected to the via contact; a photodiode connected to the first dielectric layer; a second dielectric layer formed over the photodiode; a via hole extending through the second dielectric layer and the photodiode and partially through the first dielectric layer to expose the first metal layer; a barrier metal layer formed over a portion of the sidewall of the via hole; and a second metal layer formed over the barrier metal layer and partially filling the via hole.

DRAWINGS

Example FIGS. 1A to 1G illustrate a method for manufacturing a semiconductor device in accordance with embodiments.

Figure 2:
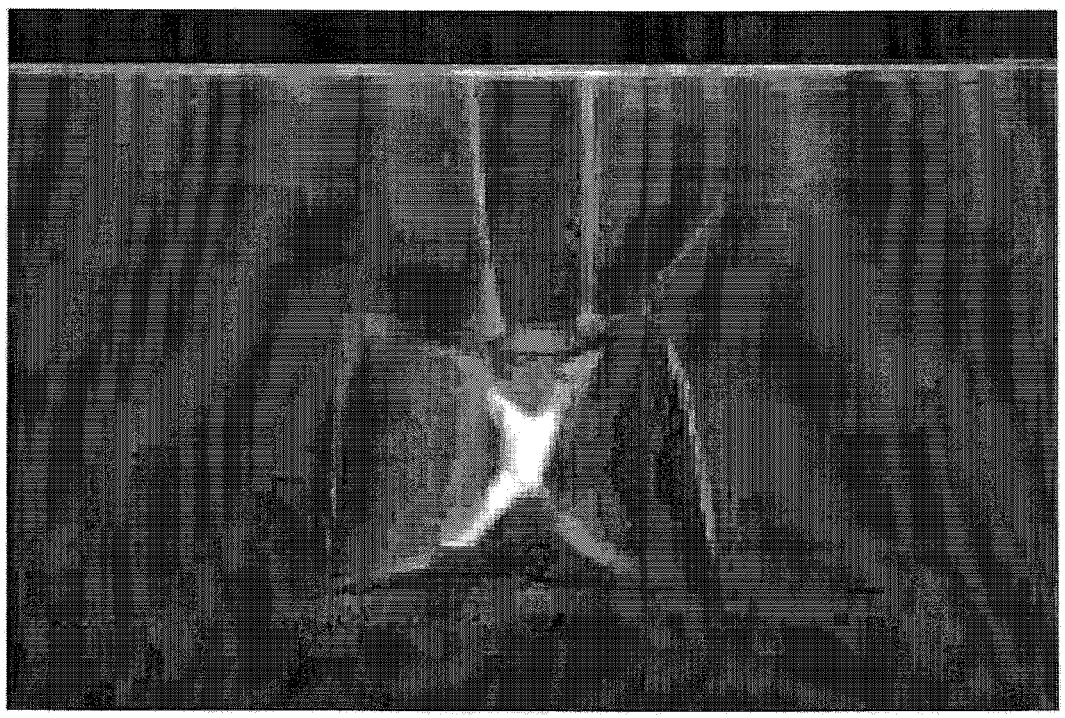
Figure 3:
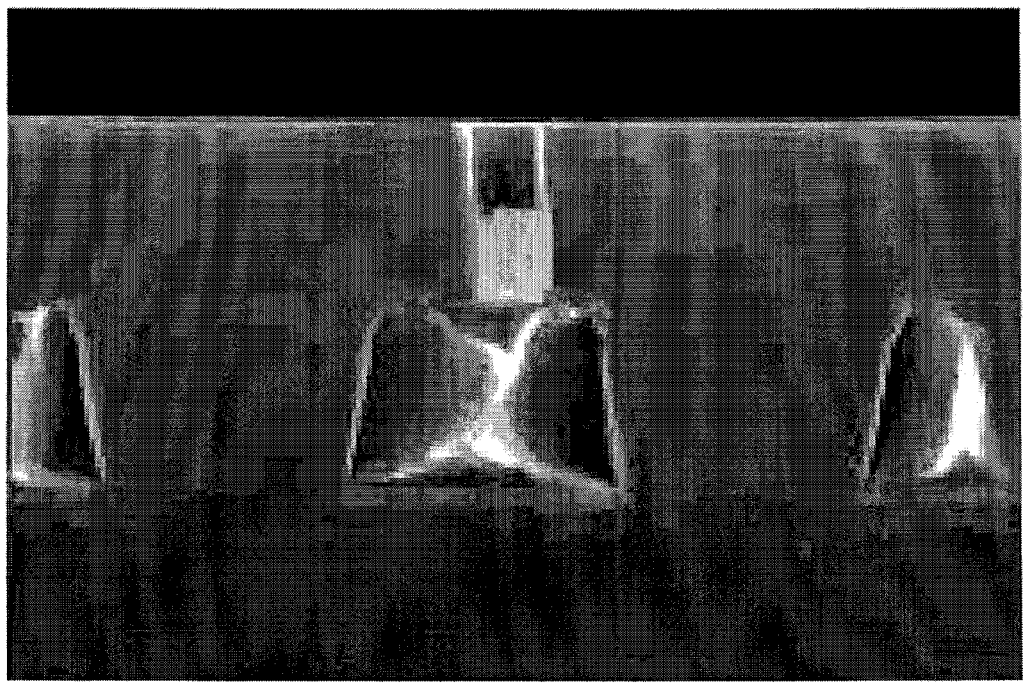

Example FIGS. 2 and 3 illustrate scanning micron electroscope (SEM) images of the removal of a barrier metal and a metal layer embedded in a via hole.

Figure 4:
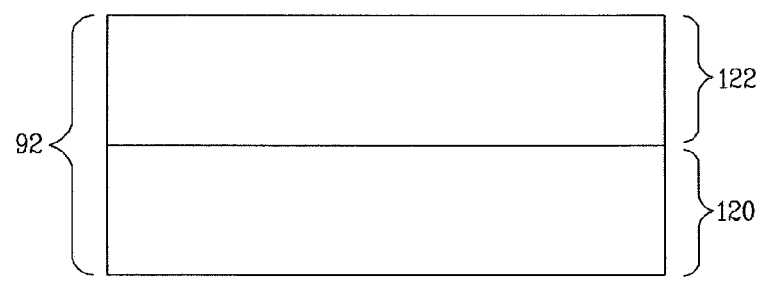
Figure 4:
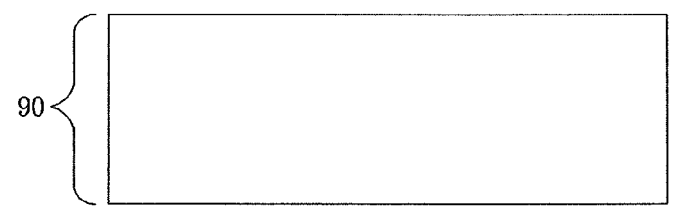

Example FIG. 4 illustrates cutting of a backside of a second wafer.

DESCRIPTION

Reference will now be made in detail to the exemplary embodiment of the present invention, examples of which are illustrated in the accompanying drawings. Wherever possible, the same reference numbers will be used throughout the drawings to refer to the same or like parts.

As illustrated in example FIG. 1A, second wafer 92 is connected or bonded to an exposed surface of first wafer 90. Thermal treatment may be applied to connect first wafer 90 and second wafer 92. First wafer 90 is patterned to include inter metal dielectric (IMD) layer 100, metal layer 102 and via contact 104 formed in IMD layer 100. Metal layer 102 may be embedded in IMD layer 100 and connected to via contact 104. IMD layer 100 may be composed of un-doped silicate glass (USG), phosphor silicate glass (PSG) or borophospho silicate glass (BPSG), etc. Second wafer 92 may be a silicon wafer having photodiode 120. Photodiode 120 may be formed through $H_2$ ion implantation and may also be PIN diode 120 that includes P layer 114, I layer 112 and N layer 110. PIN diode 120 may have thickness in a range of about 0.7 to 1.2 µm.

Figure 1B:
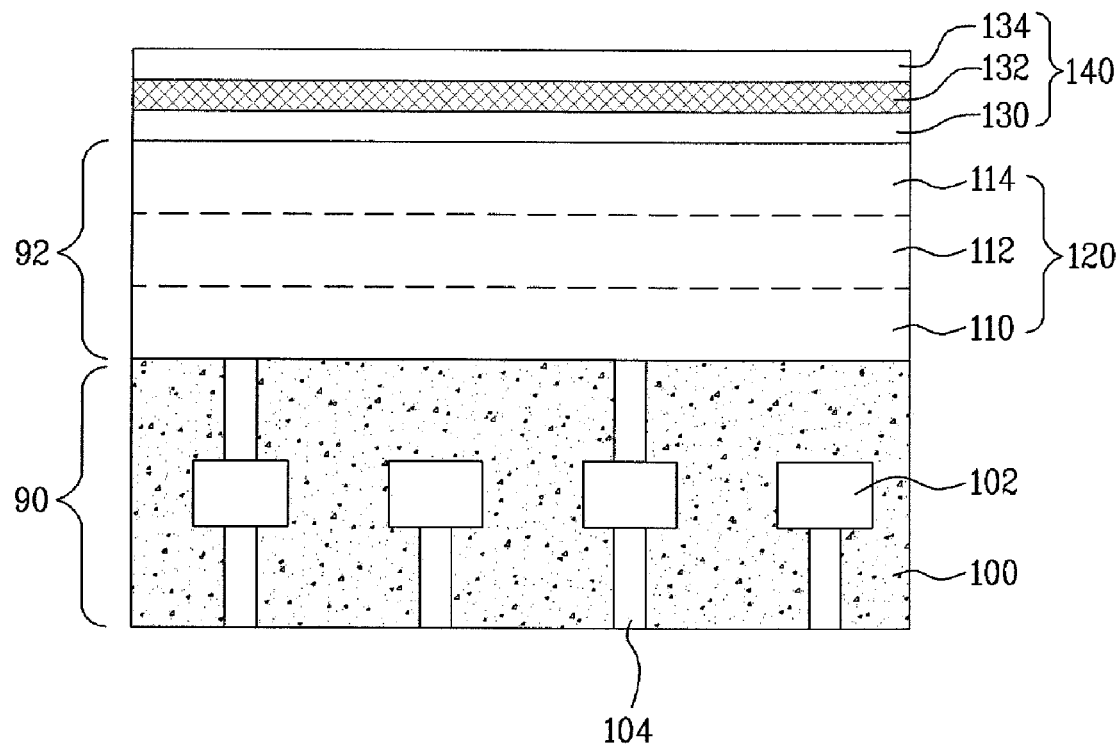

As illustrated in example FIG. 1B, next, hard mask layer 140 is formed on and/or over an exposed surface of second wafer 92. Hard mask layer 140 may have a ONO structure including first oxide layer 130, nitride layer 132 and second oxide layer 134. More specifically, hard mask layer 140 is constructed such that first oxide layer 130 is formed on and/or over and contacts an exposed surface of second wafer 92, nitride layer 132 is formed on and/or over and contacts an exposed surface of first oxide layer 130 and second oxide layer 134 is formed on and/or over an exposed surface of nitride layer 132.

Figure 1C:
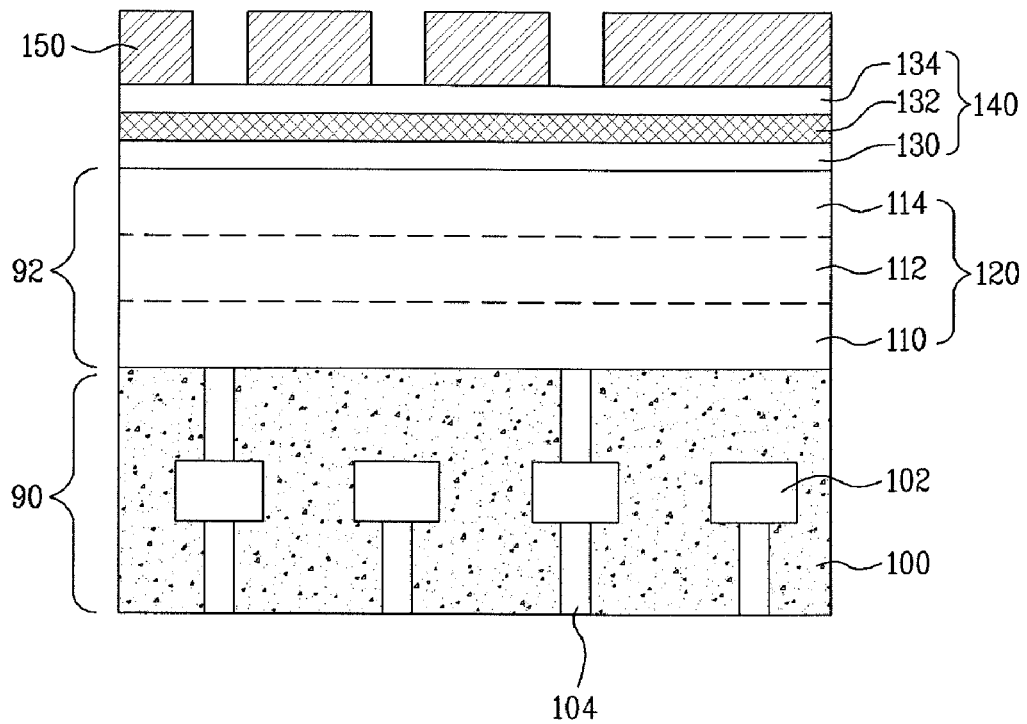

As illustrated in example FIG. 1C, photoresist pattern 150 is formed on and/or over an exposed surface of hard mask layer 140 to expose a via hole region. For example, photoresist pattern 150 may be formed by coating photoresist on and/or over the exposed region of hard mask layer 140 and then patterning the coated photoresist by photolithography.

Figure 1D:
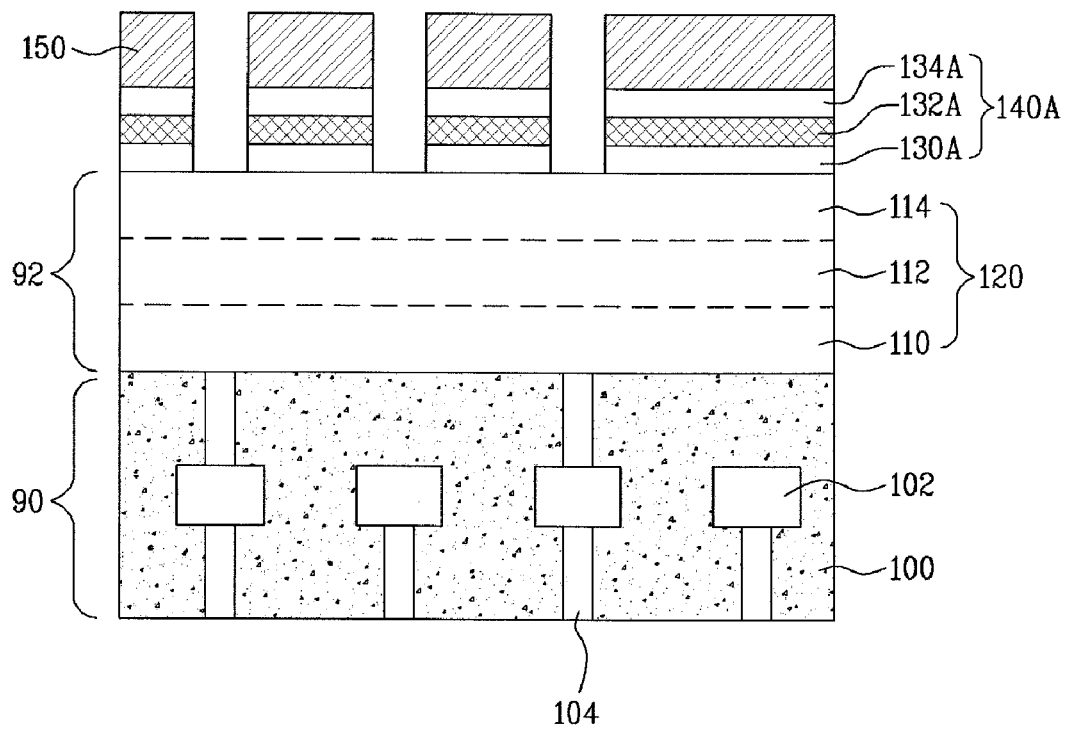

As illustrated in example FIG. 1D, hard mask layer 140 is then dry-etched using photoresist pattern 150 as an etching mask, thereby forming hard mask pattern 140A which exposes portion so the surface of photodiode 120. Hard mask pattern 140A includes first oxide pattern 130A, nitride pattern 132A and second oxide pattern 134A.

Figure 1E:
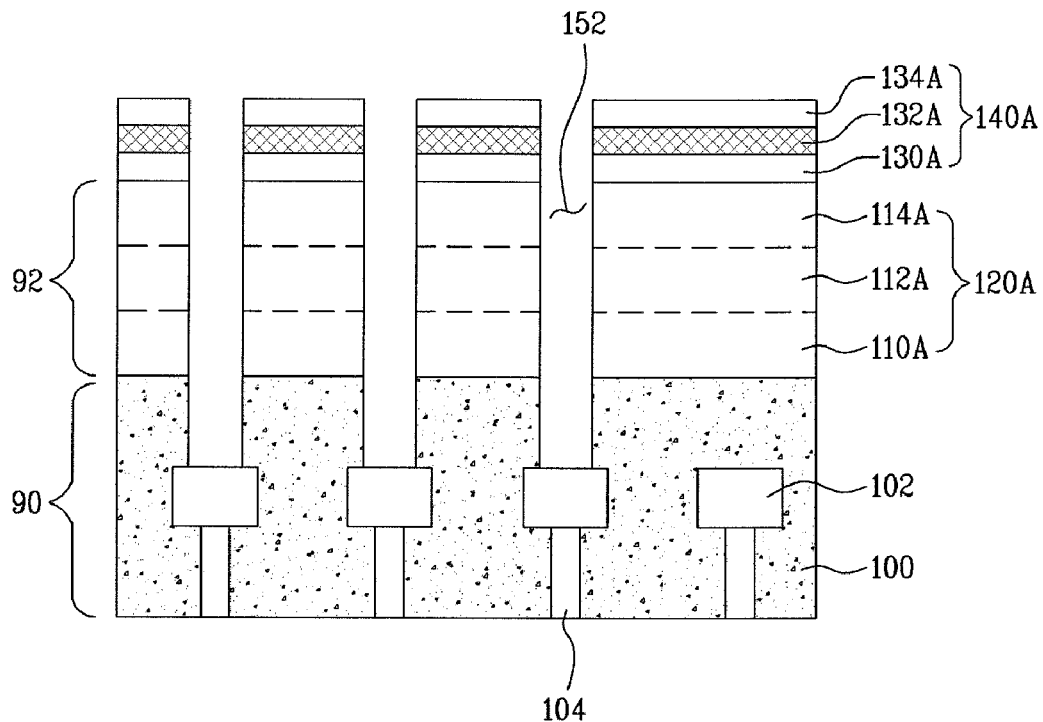

As illustrated in example FIG. 1E, photoresist pattern 150 is then removed by ashing, and then first wafer 90 and second wafer 92 are etched up to a predetermined depth using hard mask pattern 140A as an etching mask to form via hole 152. For example, via hole 152 may be formed by etching first wafer 90 and second wafer 92 to the depth of metal layer 102 formed in first wafer 90 so as to expose metal layer 102. Here, layers 110A, 112A and 114A represent the results of etching P layer 114, I layer 112 and N layer 110, respectively.

As described above, via hole 152 is formed after bonding first wafer 90 and second wafer 92 using a manufacturing method of a semiconductor device in accordance with embodiments. Therefore, non-uniformity and non-adhesion of the wafers, which formerly occurred when a deep via hole is formed prior to bonding of the wafers, may be prevented. In turn, the bonding efficiency of the wafers is enhanced.

Many polymer residues, however, may be generated as a byproduct of the patterning due to a high aspect ratio. In accordance with embodiments, such residues remaining in via hole 152 may be removed using either or both of a solvent and a hot DIW. For example, relatively hard residues may be removed in a first cleaning process using a solvent and still remaining residues may be removed by a subsequent second cleaning process using a hot DIW. The solvent may include $NH_4F$-based basic solvents. The temperature of the hot DIW may be within a range of about 79 to 90° C. because the pattern may be attacked when the hot DIW is too hot while the efficiency may be deteriorated when insufficiently hot. The hot DIW may be used for spinning or dipping method.

Figure 1F:
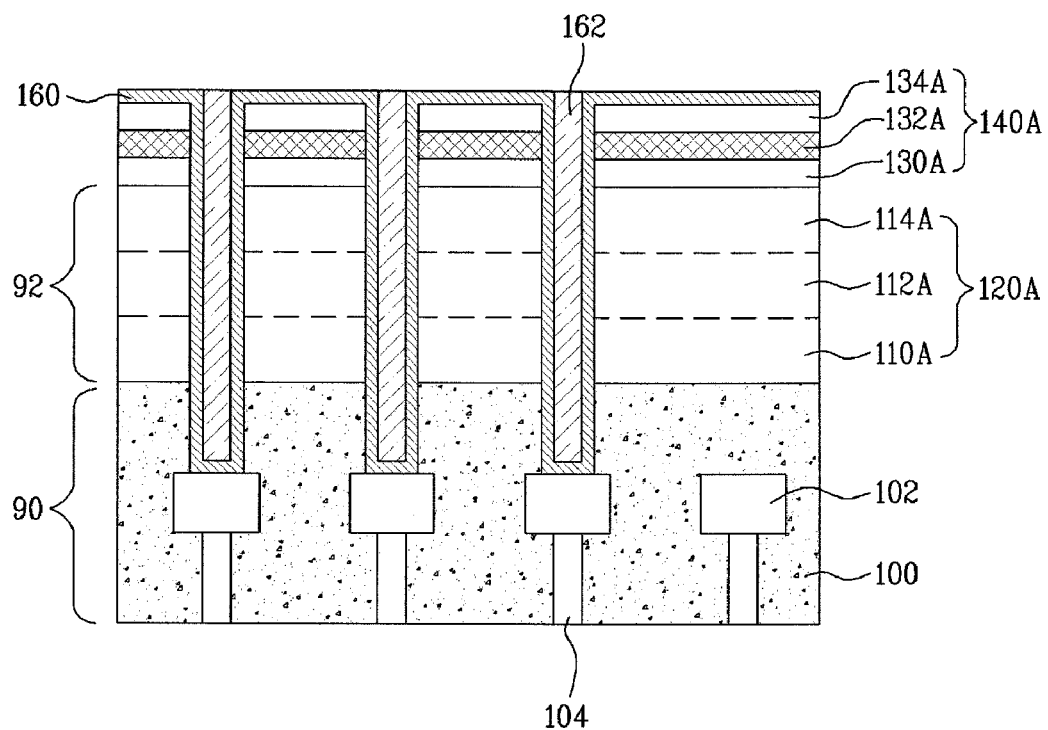

As illustrated in example FIG. 1F, barrier metal layer 160 is then formed on and/or over whole surface of hard mask pattern 140A including inside walls of via hole 152. In accordance with embodiments, barrier metal layer 160 may include a Ti or TiN-based material. Second metal layer 162 is then formed on and/or over the uppermost surface of barrier metal layer 160, thereby filling via hole 152 so that first wafer 90 and second wafer 92 are interconnected. Second metal layer 162 may include W.

Figure 1G:
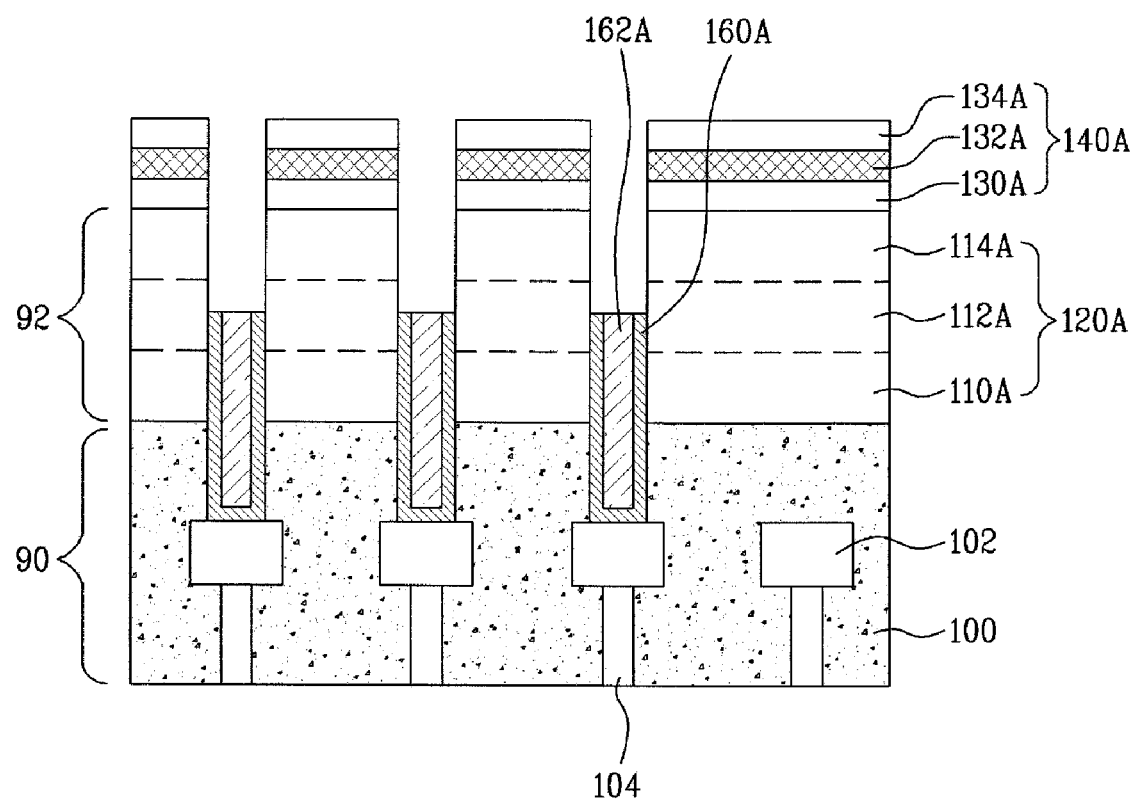

As illustrated in example FIG. 1G, a portion of barrier metal layer 160 and second metal layer 162 gap-filled in via hole 152 are selectively removed by wet etching. In accordance with embodiments, barrier metal layer 160 and second metal layer 162 may be removed to I layer 112 of PIN diode 120 formed in second wafer 92. More specifically, in order to selectively remove barrier metal layer 160 and second metal layer 162, the wet etching may be performed using a resultant material obtained by diluting a compound of $H_2SO_4$, Trimethyl Oxyethyl Ammonium-hydroxide (TMH) and $H_2O_2$ in DIW. Barrier metal film 160A and second metal film 162A may partially remain in via hole 152. The content ratio of $H_2SO_4$, TMH and $H_2O_2$ may be 1:1:20 to 1:1:50. Also, the content ratio of the compound of $H_2SO_4$, TMH and $H_2O_2$ with respect to the DIW maybe 1:40 to 1:60.

If first wafer 90 and second wafer 92 are connected without selectively removing barrier metal layer 160 and second metal layer 162 in via hole 152, the Ti or TiN layer used as barrier metal 160 may be formed not only on and/or over silicon wafers 90 and 92 but also on and/or over hard mask pattern 140a. In this case, the metal existing in a region where a dielectric is to be formed may deteriorate the device characteristics. To avoid such a case, in accordance with embodiments, the manufacturing method selectively remove portions of barrier metal 160 and second metal layer 162 to the depth of I layer 112 of PIN diode 120. Accordingly, the device characteristics may not be affected by the metal formed on and/or over hard mask pattern 140A.

Example FIGS. 2 and 3 are scanning micron electroscope (SEM) images illustrating the removal of barrier metal layer 162 and second metal layer 160 embedded in via hole 152. The SEM image as illustrated in example FIG. 2 may can be obtained when barrier metal layer 160 and second metal layer 162 filling via hole 152 are removed entirely, and the SEM image of example FIG. 3 may be obtained when partially removed. Here, the content ratio of $H_2SO_4$, TMH and $H_2O_2$ may determine whether barrier metal layer 160 and second metal layer 162 are removed entirely as illustrated in example FIG. 2 or partially removed as illustrated in example FIG. 3.

Example FIG. 4 illustrates first wafer 90 and second wafer 92 to explain cutting of a back side of second wafer 92. In accordance with embodiments, backside 122 of second wafer 92, which is an unnecessary portion, is cut out before the semiconductor device manufacturing processes of example FIGS. 1A to 1G are performed. After unnecessary backside 122 of second wafer 92 is cut, first wafer 90 and second wafer 92 may be bonded as illustrated in FIG. 1A.

Alternatively, in accordance with embodiments, the semiconductor device manufacturing processes of example FIGS. 1A to 1G may be performed without cutting backside 122. In this case, backside 122 of second wafer 92 may be cut after barrier metal layer 160 and second metal layer 162 are selectively etched.

In accordance with embodiments, a semiconductor device will be described with reference to example FIG. 1G. The semiconductor device may include first wafer 90 being patterned, second wafer 92, barrier metal film 160A and second metal film 162A. Patterned first wafer 90 includes IMD layer 100, first metal layer 102 and via contact 104 formed in IMD layer 100. First metal layer 102 is connected to via contact 104 as embedded in IMD layer 100. Second wafer 92 is connected to an exposed surface of first wafer 90 and may include a photodiode formed by $H_2$ ion implantation, for example, PIN diode 120A. Barrier metal film 160A is partially embedded in via hole 152 formed from the backside of second wafer 92 to a predetermined depth in first wafer 90. Via hole 152 is formed from the backside of second wafer 92 to first layer 102 of first wafer 90. Second metal layer 162A is formed at a surface of barrier metal film 160A to partially fill via hole 152. Barrier metal film 160A and second metal film 162A are formed in the portion of the via hole 152 only from first wafer 90 to a bonding region of second wafer 92. Here, the bonding region may be included in I layer 112 of PIN diode as illustrated in example FIG. 1G.

As apparent from the above description, in accordance with embodiments, a semiconductor device and a manufacturing method for the device may form a via hole using a hard mask pattern after two wafers are bonded to each other. Therefore, the bonding of the wafers can be very efficiently performed. In addition, residues may be almost completely removed even at a high aspect ratio by using a solvent and hot DIW after formation of the via hole. Furthermore, after embedding the barrier metal and the metal layer in the via hole, residual metal substances remaining on the hard mask pattern are selectively removed. Accordingly, the device characteristics can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
   connecting a second wafer to a first wafer; and then
   forming a hard mask layer over an exposed surface of the second wafer; and then
   forming a photoresist pattern at an exposed surface of the hard mask layer to expose a via hole region; and then
   forming a hard mask pattern by etching the hard mask layer using the photoresist pattern as an etching mask; and then
   forming a via hole by etching the first wafer and the second wafer to a predetermined depth using the hard mask pattern as an etching mask.

2. The method of claim 1, wherein forming the hard mask layer comprises:
   forming a first oxide layer over an exposed surface of the second wafer; and then
   forming a nitride layer over an exposed surface of the first oxide layer; and then
   forming a second oxide layer over an exposed surface of the nitride layer.

3. The method of claim 1, wherein the second wafer comprises a photodiode formed by $H_2$ ion implantation.

4. The method of claim 1, further comprising, after forming the via hole:
   performing two separate cleaning processes to remove residues remaining in the via hole.

5. The method of claim 4, wherein performing two separate cleaning processes comprises:
   performing a first cleaning process using a solvent; and then
   performing a second cleaning process using hot deionized water after performing the first cleaning process.

6. The method of claim 5, wherein the solvent includes a $NH_4F$-based solvent.

7. The method of claim 5, wherein the temperature of the hot deionized water is in a range of about 79 to 90° C.

8. The method of claim 1, wherein the second wafer comprises a PIN diode.

9. The method of claim 1, wherein the first wafer comprises a dielectric layer that is composed of at least one of un-doped silicate glass, phosphor silicate glass and boro-phospho silicate glass.

10. A method for manufacturing a semiconductor device comprising:
    connecting a photodiode to an exposed surface of a first dielectric layer having a via contact and a first metal layer embedded in the first dielectric layer and connected to the via contact; and then
    forming a second dielectric layer over an exposed surface of the photodiode; and then
    forming a via hole extending through the second dielectric layer and the photodiode and partially through the first dielectric layer to expose the first metal layer by performing an etching process using the second dielectric layer as a hard mask; and then
    performing a first cleaning process to remove residues from the via hole; and then
    performing a second cleaning process to remove any residues remaining in the via hole after performing the first cleaning process; and then
    forming a barrier metal layer over the second dielectric layer and sidewalls of the via hole; and then
    forming a second metal layer over the barrier metal layer and filling the via hole; and then
    selectively removing portions of the barrier metal layer and the second metal layer to expose portions of the via hole.

11. The method of claim 10, wherein the photodiode comprises a PIN diode.

12. The method of claim 11, wherein selectively removing portions of the barrier metal layer and the second metal layer comprises selectively removing portions of the barrier metal layer and the second metal layer up to an I layer of the PIN diode.

13. The method of claim 11, wherein selectively removing portions of the barrier metal layer and the second metal layer comprises performing a wet etching using a resultant material obtained by diluting a compound of $H_2SO_4$, Trimethyl Oxyethyl Ammonium-hydroxide (TMH) and $H_2O_2$ in hot deionized water.

14. The method of claim 10, wherein the first dielectric layer comprises at least one of un-doped silicate glass, phosphor silicate glass and boro-phospho silicate glass.

15. The method of claim 10, wherein the second dielectric layer comprises an Oxide-Nitride-Oxide structure including a first oxide layer, a nitride layer and a second oxide layer.

* * * * *